(12) United States Patent
D'Evelyn et al.

(10) Patent No.: US 7,625,446 B2
(45) Date of Patent: *Dec. 1, 2009

(54) HIGH TEMPERATURE HIGH PRESSURE CAPSULE FOR PROCESSING MATERIALS IN SUPERCRITICAL FLUIDS

(75) Inventors: Mark Philip D'Evelyn, Niskayuna, NY (US); Kristi Jean Narang, Voorheesville, NY (US); Robert Arthur Giddings, Slingerlands, NY (US); Steven Alfred Tysoe, Ballston Spa, NY (US); John William Lucek, Powell, OH (US); Suresh Shankarappa Vagarali, Columbus, OH (US); Robert Vincent Leonelli, Jr., Westerville, OH (US); Joel Rice Dysart, Johnstown, OH (US)

(73) Assignee: Momentive Performance Materials Inc., Albany, NY (US)

( * ) Notice: Subject to any disclaimer, the term of this patent is extended or adjusted under 35 U.S.C. 154(b) by 139 days.

This patent is subject to a terminal disclaimer.

(21) Appl. No.: 11/010,139

(22) Filed: Dec. 10, 2004

(65) Prior Publication Data

US 2005/0152820 A1    Jul. 14, 2005

Related U.S. Application Data

(62) Division of application No. 09/683,659, filed on Jan. 31, 2002, now Pat. No. 7,125,453.

(51) Int. Cl.
*C30B 11/00* (2006.01)
*C30B 28/10* (2006.01)
*C30B 15/26* (2006.01)

(52) U.S. Cl. .................. 117/11; 117/201; 117/220; 117/31; 117/34

(58) Field of Classification Search .......... 117/201–224
See application file for complete search history.

(56) References Cited

U.S. PATENT DOCUMENTS 1,879,278 A    9/1932    Jacobs
1,986,196 A    1/1935    Grosse (Continued)

FOREIGN PATENT DOCUMENTS

DE    44 13 423    10/1995

(Continued)

OTHER PUBLICATIONS

Byrappa et al., Handbook of Hydrothermal Technology, Preface, pp. ix-xiv, 2001.*

(Continued)

*Primary Examiner*—Robert M Kunemund
*Assistant Examiner*—G. Nagesh Rao
(74) *Attorney, Agent, or Firm*—Joseph E. Waters

(57) ABSTRACT

A capsule for containing at least one reactant and a supercritical fluid in a substantially air-free environment under high pressure, high temperature processing conditions. The capsule includes a closed end, at least one wall adjoining the closed end and extending from the closed end; and a sealed end adjoining the at least one wall opposite the closed end. The at least one wall, closed end, and sealed end define a chamber therein for containing the reactant and a solvent that becomes a supercritical fluid at high temperatures and high pressures. The capsule is formed from a deformable material and is fluid impermeable and chemically inert with respect to the reactant and the supercritical fluid under processing conditions, which are generally above 5 kbar and 550° C. and, preferably, at pressures between 5 kbar and 80 kbar and temperatures between 550 ° C. and about 1500° C. The invention also includes methods of filling the capsule with the solvent and sealing the capsule, as well as an apparatus for sealing the capsule.

19 Claims, 4 Drawing Sheets

U.S. PATENT DOCUMENTS

| | | | |
|---|---|---|---|
| 2,544,414 A | 3/1951 | Bridgman et al. | |
| 2,745,713 A | 5/1956 | Suits | |
| 2,785,058 A | 3/1957 | Buehler | |
| 2,895,812 A | 7/1959 | Kohman | 117/72 |
| 2,941,241 A | 6/1960 | Strong | |
| 2,947,609 A | 8/1960 | Strong | |
| 2,947,610 A | 8/1960 | Hall et al. | |
| 3,013,867 A | 12/1961 | Sawyer | 117/72 |
| 3,030,662 A | 4/1962 | Strong | |
| 3,088,170 A | 5/1963 | Strong | |
| 3,101,259 A | 8/1963 | Sawyer | 117/69 |
| 3,107,395 A | 10/1963 | Bundy | |
| 3,313,004 A | 4/1967 | Vahldiek et al. | |
| 3,473,935 A | 10/1969 | Wilson et al. | |
| 3,567,643 A | 3/1971 | Flanigen et al. | |
| 3,607,014 A | 9/1971 | Huml et al. | |
| 3,933,573 A | 1/1976 | Dugger | |
| 4,202,930 A | 5/1980 | Kokta et al. | |
| 4,430,051 A | 2/1984 | Von Platen | |
| 4,523,478 A | 6/1985 | Zacharias, Jr. | |
| 4,891,165 A | 1/1990 | Suthanthiran | |
| 4,910,403 A | 3/1990 | Kilham et al. | |
| 5,236,674 A | 8/1993 | Frushour | |
| 5,456,204 A * | 10/1995 | Dimitrov et al. | 117/71 |
| 5,868,837 A | 2/1999 | DiSalvo et al. | |
| 5,902,396 A * | 5/1999 | Purdy | 117/71 |
| 5,911,824 A | 6/1999 | Hammond et al. | |
| 5,942,148 A | 8/1999 | Preston | |
| 5,993,545 A | 11/1999 | Lupton et al. | |
| 6,113,985 A | 9/2000 | Suscavage et al. | |
| 6,177,057 B1 * | 1/2001 | Purdy | 423/409 |
| 6,270,569 B1 | 8/2001 | Shibata et al. | |
| 6,273,948 B1 | 8/2001 | Porowski et al. | |
| 6,285,010 B1 | 9/2001 | Fujikawa et al. | |
| 6,375,446 B1 | 4/2002 | Leonelli, Jr. | |
| 6,393,867 B1 | 5/2002 | Guillard | |
| 6,406,540 B1 | 6/2002 | Harris et al. | |
| 6,592,663 B1 | 7/2003 | Sarayama et al. | |
| 6,676,752 B1 | 1/2004 | Suscavage et al. | |
| 6,692,568 B2 | 2/2004 | Cuomo et al. | |
| 6,861,130 B2 | 3/2005 | D'Evelyn et al. | |
| 7,063,741 B2 * | 6/2006 | D'Evelyn et al. | 117/73 |
| 7,101,433 B2 * | 9/2006 | D'Evelyn et al. | 117/69 |
| 7,125,453 B2 * | 10/2006 | D'Evelyn et al. | 117/200 |
| 2002/0122757 A1 * | 9/2002 | Chung et al. | 422/199 |
| 2003/0041602 A1 * | 3/2003 | Williams et al. | 62/64 |
| 2003/0066800 A1 * | 4/2003 | Saim et al. | 210/634 |
| 2003/0140845 A1 | 7/2003 | D'Evelyn et al. | |
| 2003/0141301 A1 | 7/2003 | D'Evelyn et al. | |
| 2003/0164138 A1 | 9/2003 | Sarayama et al. | |
| 2003/0209191 A1 | 11/2003 | Purdy | |
| 2004/0003495 A1 | 1/2004 | Xu | |
| 2004/0134415 A1 | 7/2004 | D'Evelyn et al. | |
| 2005/0103257 A1 | 5/2005 | Xu et al. | |

FOREIGN PATENT DOCUMENTS

| | | |
|---|---|---|
| EP | 0 152 726 | 8/1985 |
| EP | 0 157 393 | 10/1985 |
| EP | 0 220 462 | 5/1987 |
| EP | 0 860 182 | 8/1998 |
| FR | 1 275 127 | 11/1961 |
| FR | 1 306 951 | 10/1962 |
| FR | 2 796 657 | 1/2001 |
| GB | 9 226 19 | 4/1963 |
| GB | 2 333 521 | 7/1999 |
| JP | 60091062 | 5/1985 |
| JP | 60122797 | 7/1985 |
| JP | 09206582 | 8/1997 |
| JP | 10005572 | 1/1998 |
| JP | 11060394 | 3/1999 |
| JP | 2001058900 | 3/2001 |
| JP | 2004066108 A | 4/2004 |
| WO | WO 98/55671 | 12/1998 |
| WO | WO 01/24921 | 4/2001 |
| WO | WO 01/36080 | 5/2001 |
| WO | WO 02/34972 | 5/2002 |
| WO | WO 03/064021 | 8/2003 |
| WO | WO 2004/053206 | 6/2004 |
| WO | WO 2004/053208 | 6/2004 |
| WO | WO 2004/071649 | 8/2004 |
| WO | WO 2005/122232 | 12/2005 |

OTHER PUBLICATIONS

Andrew D. Hanser et al, "Growth, Doping and Characterization of Epitaxial Thin Films and Patterned Structures of AlN, GaN, and $Al_xGa_{1-x}N$", Diamond and Related Materials, vol. 8, pp. 288-294, 1999.

K. Lawniczak-Jablonska et al., "Polarization Dependent X-Ray Absorption Studies of the Chemical Bonds Anisotropy in Wurtzite GaN Grown at Different Conditions", Journal of Alloys and Compounds, vol. 328, pp. 77-83, 2001.

Zhong Weizhuo, "Synthetic Crystallization", ($2^{nd}$ Edition, Scientific Publication Press, ISBN 7-03-003952-1/O.689, 2 pages, Oct. 1994.

M. Yano et al., "Growth of Nitride Crystals, BN, AlN and GaN by Using a Na Flux", *Diamond and Related Materials*, Elsevier Science Publishers, Amsterdam, NL, vol. 9, No. 3-6, pp. 512-515, Apr. 2000.

Masaichi Yano et al., "*Control of Nucleation Site and Growth Orientation of Bulk GaN Crystals*", Japanese Journal of Applied Physics, Publication Office Japanese Journal of Applied Physics, Tokyo, Japan, vol. 38, No. 10A, Part 2, pp. L1121-L1123, Oct. 1, 1999.

Joseph W. Kolis et al., "Materials Chemistry and Bulk Crystal Growth of Group III Nitrides in Supercritical Ammonia", Materials Research Society, vol. 495, pp. 367-372, 1998.

Masato Aoki et al., "Growth of 5 mm GaN Single Crystals at 750° C. From An Na-Ga Melt", American Chemical Society, Crystal Growth & Design, vol. 1, No. 2, pp. 119-122, Feb. 3, 2001.

S. Porowski, "Near Defect Free GaN Substrates", High Pressure Research Center, Polish Academy of Sciences Sokolowska 29/37, 01-142 Warsaw, Poland, sylvek@unipress.waw.pl, 11 pages, 1999.

S. Porowski et al., "Growth of GaN single Crystals Under High Nitrogen Pressure", High Pressure Research Center, Polish Academy of Sciences, ul. Sokolowska 29/37, 01-142, Warsaw, Poland, Chapter 9, pp. 295-313, 1997.

M. Bickermann et al, "Characterization of Bulk AlN With Low Oxygen Content", Journal of Crystal Growth, vol. 269, pp. 432-442, 2004.

Handbook of Hydrothermal Technology, K. Byrappa and Masahiro Yoshimura, "*Apparatus*", pp. 82-160, 2001.

Dissertation: Cubic Boron Nitride: Stability of the Domain and new Ways of Elaboration, Translated from French by the Ralph McElroy Co., Custom Division, PO Box 4828, Austin, Texas 78765 USA.

Materials Science, H. Jacobs and D. Schmidt, "*High Pressure Ammonolysis in Solid-State Chemistry*", vol. 8, Chapter 5, pp. 383-427, 1982.

J. Superhand Maker, VL Solozhenko, AB Slutskii and Yu. A. Ignatiev, "*On The Lowest Pressure of Sphaleritic Boron Nitride Spontaneous Crystallization*", vol. 14, No. 6, Letters to the Editor, Allerton Press, Inc., p. 64, 1992.

American Mineralogist, Mark A. Sneeringer and Bruce Watson, "*Milk Cartons and Ash Cans: Two Unconventional Welding Techniques*", vol. 70, pp. 200-201, 1985.

Instruments and Experimental Techniques, ES Itskevich, "*High-Pressure Cells for Studies of Properties of Solids* (Review)", vol. 42, No. 3, pp. 291-302, 1999.

Scott L. Boettcher et al, American Mineralogist, "*A Simple Device for Loading Gases in High-Pressure Experiments*", vol. 74, pp. 1383-1384, 1989.

\* cited by examiner

HIGH TEMPERATURE HIGH PRESSURE CAPSULE FOR PROCESSING MATERIALS IN SUPERCRITICAL FLUIDS

CROSS REFERENCE TO RELATED APPLICATIONS

This patent application is a divisional patent application of U.S. patent application Ser. No. 09/683,659 filed Jan. 31, 2002 now U.S. Pat. No. 7,125,453, the entire contents of which is hereby incorporated by reference.

FEDERAL RESEARCH STATEMENT

The United States Government may have certain rights in this invention pursuant to Cooperative Agreement No. 70NANB9H3020, awarded by the National Institute of Standards and Technology, United States Department of Commerce.

BACKGROUND OF INVENTION

The invention relates generally to a capsule to be used with pressure vessels. More particularly, the invention relates to a capsule used in conjunction with a high-pressure vessel for processing at least one material in a supercritical fluid.

Supercritical fluids (also referred to hereinafter as "SCF") may be used to process a wide variety of materials. Examples of SCF applications include extractions in supercritical carbon dioxide, the growth of quartz crystals in supercritical water, and the synthesis of a variety of nitrides in supercritical ammonia.

Processes that employ supercritical fluids are generally performed at high pressure and high temperature (also referred hereinafter as "HPHT") within a pressure vessel. Most conventional pressure vessels not only provide a source of mechanical support for the pressure applied to reactant materials and SCF, but also serve as a container for the supercritical fluid and material being processed. The processing limitations for such pressure vessels are typically limited to a maximum temperature in the range between about 550° C. and 750° C. and a maximum pressure in the range between about 2 kilobar (also referred hereinafter as "kbar") and 5 kbar.

Processing material with supercritical fluids requires a container or capsule that is both chemically inert and impermeable to the solvent and any gases that might be generated by the process. In one approach, the material to be processed, along with a solid or liquid that forms a supercritical fluid at elevated temperatures, is introduced into a capsule. The capsule is then sealed in air, placed in a high pressure apparatus, and heated. The solid (or liquid) decomposes upon heating to provide a supercritical fluid. When such a solid or liquid is used as the SCF source, however, decomposition products other than the supercritical fluid that remain in the reaction mixture may contaminate the reaction mixture. Additional contamination may also result from air introduced during filling of the capsule.

In one method, air may be excluded from a capsule by placing the material to be processed into a fused silica tube having a closed end, evacuating the tube through a vacuum manifold, and condensing a solvent into the tube. The tube is then sealed, usually by welding, without exposing the contents of the capsule to air. Once the capsule is sealed, however, the material inside the tube cannot be processed at internal pressures greater than about 6 bar and temperatures higher than about 300° C., as the internal pressure generated by vaporization of the solvent will cause the sealed capsule to burst when heated to higher temperatures. An external pressure greater than or equal to the internal pressure can be provided by placing the capsule inside a pressure vessel and filling the space between the capsule and the pressure vessel with a solvent. However, as noted above, such pressure vessels are typically limited to a maximum temperature in the range between about 550° C. and 750° C. and a maximum pressure in the range between about 2 and 5 kbar.

If the pressure, temperature, chemical-inertness, size, sealing, and cost limitations of currently available capsules could be extended, supercritical fluids could be used to process a wider range of materials. Therefore, what is needed is an improved capsule or container for processing of materials with supercritical fluids in an air-free environment. What is also needed is a capsule that can be utilized with a solvent that is gaseous at room temperature. What is further needed is a chemically inert capsule that may be used in conjunction with a pressure vessel that is capable of generating pressures greater than about 5 kbar and temperatures between about 550° C. and about 1500° C. What is further needed is a chemically inert capsule that can cost-effectively process materials on a larger scale.

SUMMARY OF INVENTION

The present invention meets these and other needs by providing a high pressure, high temperature (also referred to herein as "HPHT") capsule for containing at least one reactant and a supercritical fluid in a substantially air-free environment. The HPHT capsule is chemically inert with respect to the at least one material and the supercritical fluid. The present invention also includes methods of filling and sealing the HPHT capsule, as well as an apparatus for sealing the HPHT capsule.

Accordingly, one aspect of the invention is to provide a high pressure, high temperature capsule for containing at least one material and a solvent that becomes a supercritical fluid in a substantially air-free environment. The capsule comprises: a closed end; at least one wall adjoining the closed end and extending therefrom; and a sealed end adjoining the at least one wall opposite the closed end, wherein the at least one wall, closed end, and sealed end define a chamber therein for containing the at least one material and solvent. The capsule is formed from a deformable material and is fluid impermeable and chemically inert with respect to the at least one material and the supercritical fluid.

A second aspect of the invention is to provide a plug for sealing a high pressure, high temperature capsule for containing at least one material and a supercritical fluid in a substantially air-free environment. The capsule has at least one wall, a closed end, and a sealed end defining a chamber therein for containing the at least one material and supercritical fluid. The plug comprises a cold-weldable material and is sealingly insertable in an open end of the capsule. The sealed end of the capsule is formed by inserting the plug into the open end and cold welding the plug to the capsule.

A third aspect of the invention is to provide a high pressure, high temperature capsule for containing at least one material and a solvent that becomes a supercritical fluid in a substantially air-free environment. The capsule comprises: a closed end; at least one wall adjoining the closed end and extending therefrom; and a sealed end adjoining the at least one wall opposite the closed end, wherein the at least one wall, closed end, and sealed end define a chamber therein for containing the at least one material and solvent. The sealed end comprises a plug that is cold-welded to the at least one wall of the capsule. The capsule is formed from a deformable cold-weldable material and is fluid impermeable and chemically inert with respect to the at least one material and the supercritical fluid.

A fourth aspect of the invention is to provide a method of filling a capsule with at least one material and a solvent that becomes a supercritical fluid in a substantially air-free environment. The capsule has at least one wall, a closed end, and an open sealable end defining a chamber therein for containing the at least one material and the solvent. The method comprises the steps of: providing the capsule; providing the at least one material to the chamber; providing a solvent source, wherein the solvent source contains the solvent that becomes a supercritical fluid at high pressure and high temperature and is connectable to a vacuum manifold; connecting the solvent source to the vacuum manifold; placing the chamber of the capsule in fluid communication with the vacuum manifold and evacuating the chamber to a predetermined pressure; cooling the chamber to a temperature below a predetermined temperature; placing the chamber and the solvent source in fluid communication with each other through the vacuum manifold; and providing a portion of the solvent into the chamber, thereby filling the open-ended capsule to a predetermined level.

A fifth aspect of the invention is to provide a method of sealing a high pressure, high temperature capsule containing at least one material and a solvent that becomes a supercritical fluid at high pressure and high temperature in a substantially air-free environment. The capsule has at least one wall, a closed end, and an open sealable end defining a chamber therein for containing the at least one material and solvent. The method comprises the steps of: providing the capsule containing the at least one material; placing the chamber of the capsule in communication with a vacuum manifold and evacuating the chamber to a predetermined pressure; filling the chamber with a predetermined quantity of the solvent; and sealing the open sealable end of the capsule.

A sixth aspect of the present invention is to provide an apparatus for sealing a high pressure, high temperature capsule with a cold-weldable plug to form a substantially air-free chamber within the capsule. The apparatus comprises: a movable ram for inserting the cold-weldable plug into an open sealable end of the capsule; a mechanical support for supporting the capsule and guiding the ram, wherein the mechanical support and the ram form an air-tight inner chamber; and a vacuum inlet passing through the mechanical support to the air-tight inner chamber, wherein the vacuum inlet provides fluid communication between the air-tight inner chamber and a vacuum manifold. The cold-weldable plug is cold-welded to at least one wall of the capsule when the cold-weldable plug is inserted into the open sealable end and a pressure is applied to the ram.

A seventh aspect of the invention is to provide a gallium nitride single crystal. The gallium nitride single crystal is formed by: providing at least one gallium nitride source material to a high pressure, high temperature capsule, the capsule having at least one wall, a closed end, and an open sealable end defining a chamber therein for containing the at least one material and a solvent that becomes a supercritical fluid at high temperature and high pressure; placing the chamber of the capsule in communication with a vacuum manifold and evacuating the chamber to a predetermined pressure; filling the chamber with a predetermined quantity of the solvent; sealing the open sealable end of the capsule; disposing the sealed capsule within a pressure vessel comprising a pressure transmission medium surrounding the capsule for maintaining an outer pressure on the capsule, a heating element insertable in the pressure transmission medium such that the heating element surrounds the capsule, a restraint to contain and hold in place the capsule, the pressure transmission medium, the heating element, and at least one seal between the restraint and the pressure transmission medium; and subjecting the capsule to high pressure, high temperature conditions, wherein the solvent contained within the sealed capsule becomes a supercritical fluid and generates a predetermined pressure within the sealed capsule, and wherein the supercritical fluid reacts with the at least one gallium nitride source material to form the gallium nitride single crystal.

These and other aspects, advantages, and salient features of the present invention will become apparent from the following detailed description, the accompanying drawings, and the appended claims.

DETAILED DESCRIPTION

Figure 1:
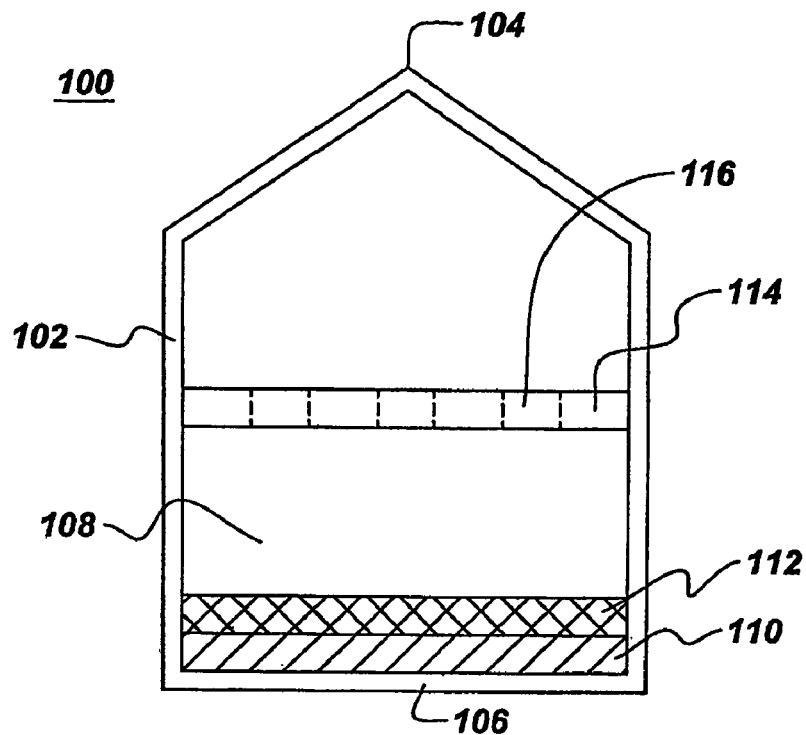
FIG. 1 is a schematic cross-sectional representation of a capsule according to the present invention.

In the following description, like reference characters designate like or corresponding parts throughout the several views shown in the figures. It is also understood that terms such as "top," "bottom," "outward," "inward," and the like are words of convenience and are not to be construed as limiting terms.

Referring to the drawings in general and to FIG. 1 in particular, it will be understood that the illustrations are for the purpose of describing a preferred embodiment of the invention and are not intended to limit the invention thereto. Turning to FIG. 1, capsule 100 has a closed end 106, at least one wall 102 adjoining the closed end 106 and extending therefrom, and a sealed end 104 adjoining the at least one wall 102 opposite the closed end 106. Closed end 106, the at least one wall 102, and sealed end 104 define a closed chamber 108 within the capsule 100 for containing at least one material 110 and a solvent 112 that becomes a supercritical fluid at a high pressure and high temperature (also referred to herein as "HPHT"). HPHT conditions encompass temperatures greater than about 100° C. and pressures greater than about 1 atmosphere.

Capsule 100 is chemically inert and impermeable with respect to the at least one material 110, solvent 112, and the supercritical fluid formed by the solvent 112. Capsule 100 is preferably impermeable to at least one of hydrogen, oxygen, and nitrogen. Closed end 106, at least one wall 102, and sealed end 104 each have a thickness of between about 0.2 mm and about 10 mm.

Capsule 100 is formed from a deformable material to allow expansion of the capsule as pressure increases within the capsule 100, thus preventing the capsule 100 from bursting. In one embodiment, the deformable material may comprise at least one of copper, copper-based alloy, gold, silver, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, combinations thereof, and the like. In another embodiment, capsule 100 is formed from a cold-weldable material, such as, but not limited to, at least one of copper, copper-based alloy, gold, silver, palladium, platinum, iridium, ruthenium, rhodium, osmium, iron, iron-based alloy, nickel, nickel-based alloy, molybdenum, and combinations thereof. Iron-base alloys that may be used to form capsule 100 include, but are not limited to, stainless steels. Nickel-base alloys that may be used to form capsule 100 include, but are not limited to, inconel, hastelloy, and the like.

Capsule 100 may also be provided with at least one baffle 114, which divides chamber 108 into two separate regions. The two regions are in fluid communication with each other, as baffle 114 has a plurality of through-holes 116. Thus, a fraction of the cross-sectional area of the baffle 114 is open. In one embodiment, baffle 114 has a fractional open area of between about 0.5% and about 30%. Baffle 114 is formed from at least one of copper, copper-based alloy, gold, silver, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, silica, alumina, and combinations thereof. Iron-base alloys that may be used to form baffle 114 include, but are not limited to, stainless steels. Nickel-base alloys that may be used to form baffle 114 include, but are not limited to, inconel, hastelloy, and the like. Baffle 114 serves the purpose of confining the at least one material 110 to a specific region or end of chamber 108 while permitting solvent 112 and, under HPHT conditions, supercritical fluid, to migrate throughout chamber 108 by passing freely through through-holes 116 in baffle 114. This feature is particularly useful in applications such as crystal growth, in which the supercritical fluid transports the at least one material 110 from one region of the chamber 108, defined by placement of baffle 114, to another region where nucleation and crystal growth take place.

Figure 5:
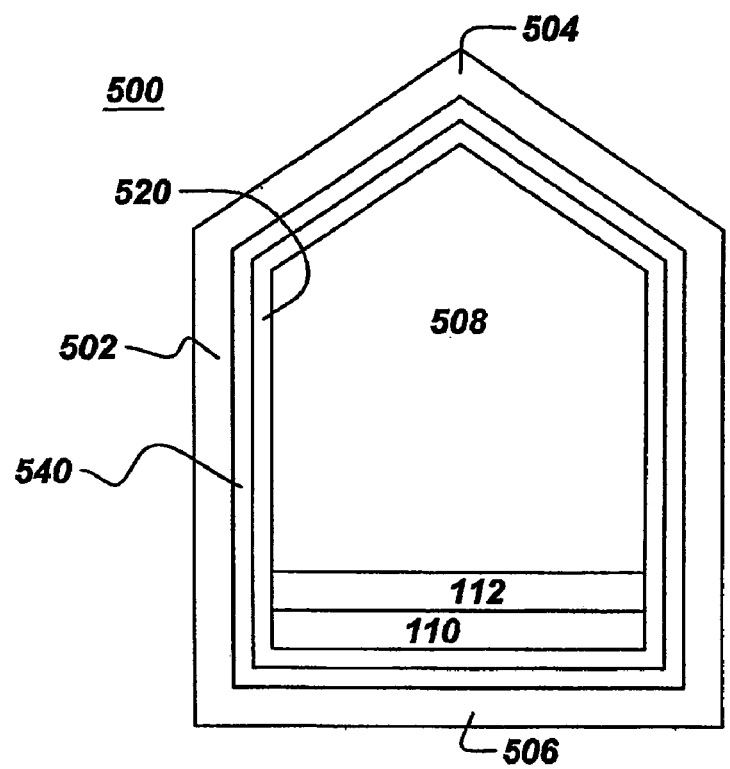
FIG. 5 is a schematic cross-sectional representation of a capsule of the present invention having a coating disposed on the inner surface of the capsule.

In one embodiment, shown in FIG. 5, at least one coating 520 is disposed on an inner surface of at least one of closed end 506, the at least one wall 502, and sealed end 504 of capsule 500. When capsule 500 includes baffle 114, the at least one coating 520 is disposed on baffle 114 as well. Coating 520 may serve the purpose of enhancing the impermeability and resistance of capsule 500 to chemical attack by its contents. Coating 520 has a thickness of between about 0.5 micron and about 250 microns. Coating 520 is formed from a material that is different from that used to form closed end 506, the at least one wall 502, and sealed end 504 and comprises at least one of: nickel; rhodium; gold; silver; palladium; platinum; ruthenium; iridium; tantalum; tungsten; rhenium; $MC_xN_yO_z$, wherein M is at least one of aluminum, boron, silicon, titanium, vanadium, chromium, yttrium, zirconium, lanthanum, a rare earth metal, hafnium, tantalum, tungsten, and wherein each of x, y, and z is between 0 and 3 (i.e., 0<x, y, z<3); and combinations thereof.

Capsule 500 may further include a diffusion barrier coating 540 disposed between coating 520 and the inner surface of at least one of closed end 506, the at least one wall 502, and sealed end 504 to reduce interdiffusion between closed end 506, the at least one wall 502, sealed end 504, and coating 520. Diffusion barrier 540 is formed from a material that is different from that of coating 520, closed end 506, the at least one wall 502, and sealed end 504 and comprises at least one of nickel, rhodium, platinum, palladium, iridium, ruthenium, rhenium, tungsten, molybdenum, niobium, silver, iridium, tantalum, $MC_xN_yO_z$, wherein M is at least one of aluminum, boron silicon, titanium, vanadium, chromium, yttrium, zirconium, lanthanum, a rare earth metal, hafnium, tantalum, tungsten, and wherein each of x, y, and z is between 0 and 3. (i.e., 0<x, y, z<3); and combinations thereof. Diffusion barrier 540 has a thickness of between about 10 nm and about 100 microns.

Figure 3:
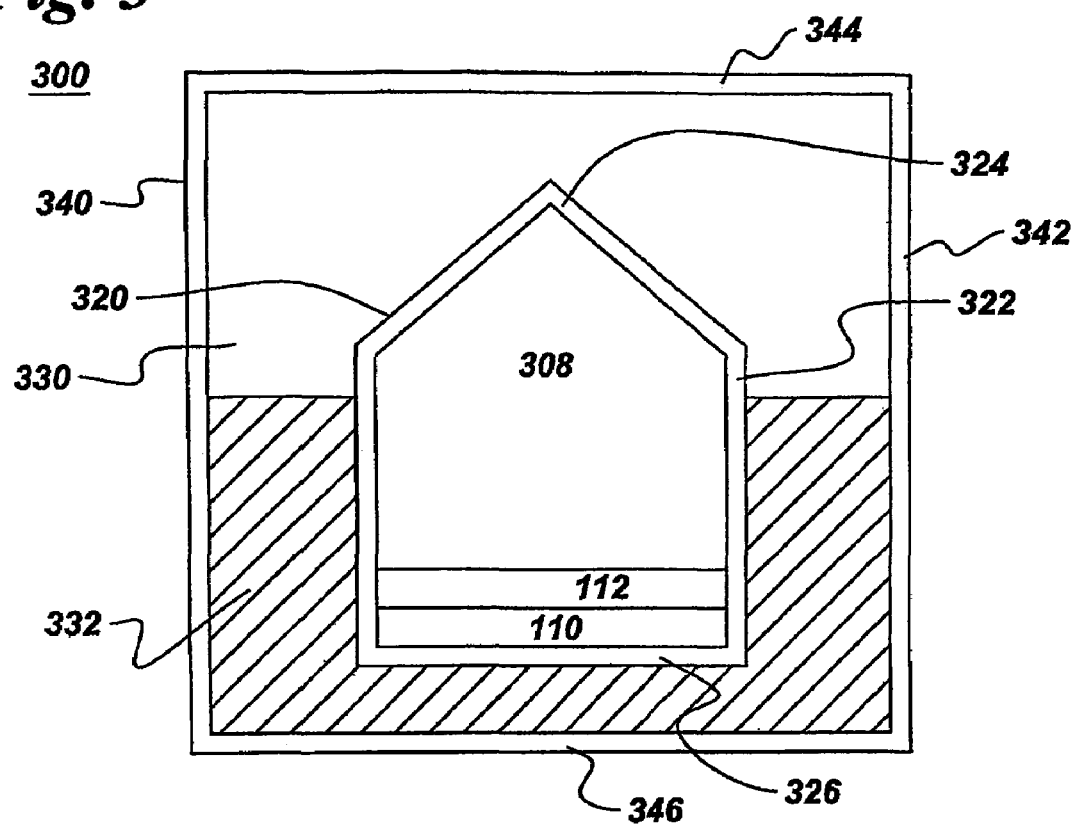
FIG. 3 is a schematic cross-sectional representation of a capsule of the present invention comprising an outer capsule, an inner capsule, and a pressure medium disposed in a free space between the inner and outer capsules.

In another embodiment, shown in FIG. 3, capsule 300, further includes an inner capsule 320 nestingly contained within an outer capsule 340. Each of outer capsule 340 and inner capsule 320 has a closed end 346, 326, at least one wall 342, 322 adjoining the closed end 346, 326 and extending from therefrom, and a sealed end 344, 324 adjoining the at least one wall 342, 322 opposite the closed end 346, 326, respectively. A closed chamber 308 for containing at least one material 110 and solvent 112 that becomes a supercritical fluid at HPHT within inner capsule 320 is defined by closed end 326, at least one wall 322, and sealed end 324. Baffle 114 dividing the chamber 308 into two portions may be optionally located within the inner capsule 320.

Outer capsule 340 and inner capsule 320 may be formed from any of the deformable or cold-weldable materials previously disclosed. Additionally, the inner capsule 320 may be formed from either a fused silica or quartz or a glass such as, but not limited to, Pyrex®, Vycor® glass, borosilicate glass, aluminosilicate glass, soda lime glass, soda barium glass, soda zinc glass, lead glass, potash soda lead glass, potash lead glass, potash soda barium glass, or the like. Each of the at least one wall 322, sealed end 324, and closed end 326 of inner capsule 320 may have a thickness of between about 0.1 mm and about 10 mm.

A spaced-apart relation exists between outer capsule 340 and inner capsule 320, such that a free space 330 exists between outer capsule 340 and inner capsule 320. The free space 330 may be at least partially filled with a pressure medium 332 to either equalize or counterbalance the pressure generated within inner capsule 320 under HPHT conditions where the solvent 112 becomes a supercritical fluid. Alternatively, pressure medium 332 may provide an overpressure so that inner capsule 320 is under a compressive or neutral stress, rather than under tension, during processing under HPHT conditions. Pressure medium 332 may comprise the same material as solvent 112 contained within inner capsule 320. Alternatively, pressure medium 332 may be any other substance, such as, but not limited to, water, carbon dioxide, ammonia, or the like, that forms a supercritical fluid under HPHT conditions.

Figure 2:
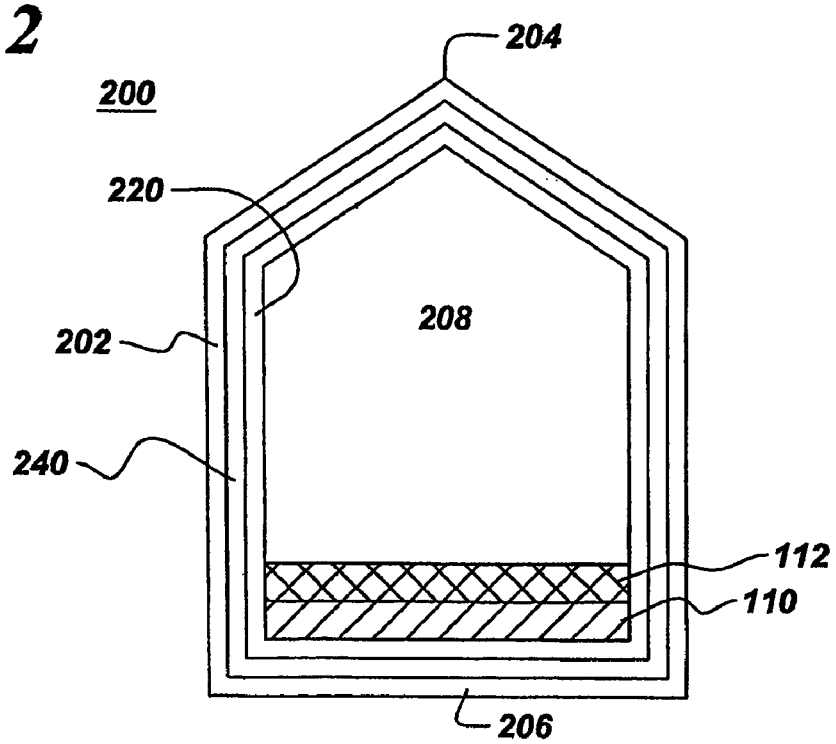
FIG. 2 is a schematic cross-sectional representation of a capsule of the present invention having an inert liner and diffusion barrier disposed on the inner surface of the capsule.

In another embodiment of the invention, shown in FIG. 2, capsule 200 includes an inert liner 220 to prevent or minimize chemical attack by the at least one material 110, solvent 112, or supercritical fluid. Inert liner 220 has a thickness of between about 10 microns and about 5 mm, and may comprise at least one of gold, platinum, rhodium, palladium, silver, iridium, ruthenium, osmium, tantalum, tungsten, rhenium, molybdenum, niobium, zirconium, yttrium, titanium, vanadium, chromium, silica, and combinations thereof. Inert liner 220 is slidingly inserted into capsule 200 prior to introducing the at least one material 110 and solvent 112 into capsule 200.

Capsule 200 may further include a diffusion barrier 240 disposed between the inert liner 220 and the inner surface of at least one of closed end 206, the at least one wall 202, and sealed end 204. Diffusion barrier 240 is formed from a material that is different from that of inert liner 220 and closed end 206, the at least one wall 202, and sealed end 204, and comprises at least one of nickel, rhodium, platinum, palladium, iridium, ruthenium, rhenium, tungsten, molybdenum, niobium, silver, iridium, tantalum, aluminum, boron oxide, boron nitride, boron carbide, aluminum, silicon, titanium, vanadium, chromium, yttrium, zirconium, lanthanum, a rare earth metal, hafnium, tantalum, tungsten, and combinations thereof. Diffusion barrier 240 has a thickness of between about 10 nm and about 100 microns.

Sealed end 104 is formed after introducing the at least one material 110 and solvent 112 into chamber 108. In one embodiment, prior to forming the sealed end, the at least one wall 102 and closed end 106 define an open chamber 108 into which the at least one material 110 and—optionally—baffle 114 are placed. The at least one material 110 to be processed in a supercritical fluid at high pressure and high temperature is added to the capsule inside a glove box or another controlled-atmosphere container. The at least one wall 102 is then coupled to a vacuum manifold (not shown) at a point opposite closed end 106. A solvent source, such as a vial or tank containing solvent 112, is also coupled to the vacuum manifold. The open chamber of the capsule is then evacuated to a predetermined pressure of less than about 1 torr and, preferably, less than about 1 millitorr. The open chamber is cooled to a temperature at which solvent 112 is either a solid or liquid. The vapor pressure of solvent 112 within the open chamber of the capsule is less than the vapor pressure of solvent 112 within the solvent source, and is preferably below about 760 torr. The open chamber may be cooled, for example, by contacting the external surfaces of closed end 106 and the at least one wall 102 with a cooling medium, such as, but not limited to, water, ice, an ice bath, dry ice, liquid nitrogen, and the like.

Once the open chamber is sufficiently cooled, the solvent source is placed in fluid communication with the open chamber and solvent 112 is introduced into the open chamber by either condensation or injection. In one embodiment, the quantity of solvent that is condensed into the open chamber of the capsule 100 is metered by filling a known volume within the vacuum manifold with a known pressure of solvent. As solvent condenses in the open chamber of the capsule, the decrease in solvent pressure within the known volume is monitored. The amount of solvent condensed in the open chamber may then be calculated from the known volume and the change of solvent pressure. Alternatively, a mass flow controller (not shown) may be located between the solvent source and the open chamber of the capsule. The solvent vapor may then be allowed to pass from the solvent source through the mass flow controller to the open chamber at a fixed rate for a fixed period of time. The quantity of solvent vapor condensed within the open chamber can then be determined from the flow rate and time allowed for flow of the solvent into the open chamber. After a predetermined amount of solvent 112 has been introduced into the open chamber, sealed end 104 is formed at a point opposite closed end 106 while maintaining the open chamber either under vacuum or under the vapor pressure of the solvent. Once sealed, the closed chamber 108 within capsule 100 is substantially air-free, and the at least one material 110 contained therein can be processed with reduced risk of contamination.

In one embodiment of the invention, sealed end 104 is formed by pinching off or collapsing a portion of the at least one wall 102 at a point opposite closed end 106 to form a weld. In both instances, the open chamber is maintained either under vacuum or with only the solvent vapor present until sealed end 104 is formed. If the at least one wall 102 is formed from a cold-weldable material, then pressure may be mechanically applied to points on an outer surface of the at least one wall 102 to pinch a portion of the inner surface of the at least one wall 102 together to form a cold-welded bond, thereby forming sealed end 104. Alternatively, sealed end 104 can be formed by heating a portion of the outer surface of the at least one wall 102 at a point opposite closed end 106 to collapse the portion of the at least one wall 102 and form a hot weld at the inner surface of the at least one wall 102 at that point. The hot weld may be formed by torch welding, arc welding, ultrasound welding, vibratory welding, or the like.

Figure 6:
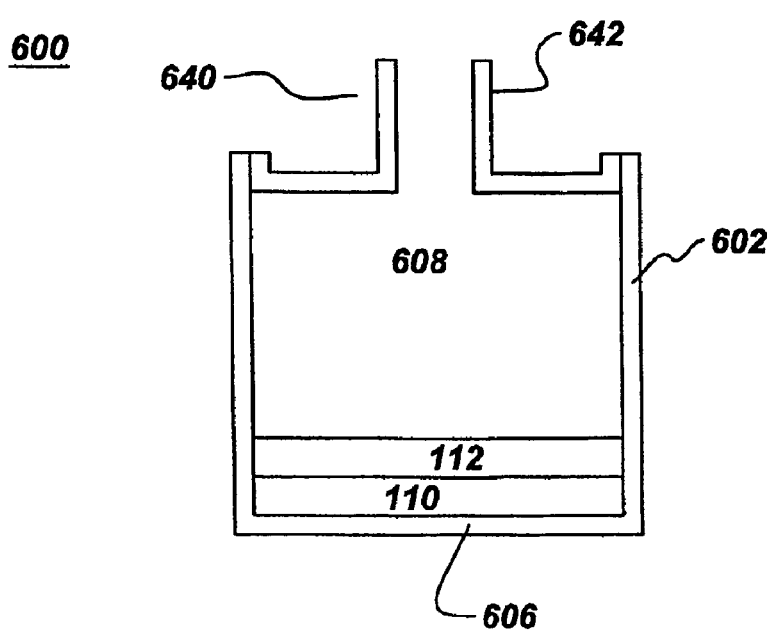
FIG. 6 is a schematic cross-sectional representation of a capsule of the present invention in which a lid having a fill tube is used to form the sealed end of the capsule.

Pinching or collapsing is preferred for forming the sealed end 104 when the opening to the open chamber is less than about 0.25 inch. For larger capsules, however, the formation of sealed end 104 by pinching or collapsing is more difficult. In addition, a capsule having a pinched-off seal often has a low symmetry shape that is difficult to pack into tooling used for HPHT processing. An embodiment comprising a sealingly insertable plug, described below, works well when the opening to the open chamber is between about 0.25 inch and about 1 inch. For still larger diameter capsules, the formation of sealed end 104 by cold-welding a plug is more difficult. Capsules having a diameter of greater than about 1 inch may be sealed by providing the at least one wall 602 with a cap or lid 640 having a fill tube 642 at a point opposite closed end 606, as illustrated in FIG. 6. Lid 640 and fill tube 642 are formed from at least one of copper, copper-based alloy, gold, silver, palladium, platinum, iridium, ruthenium, rhodium, osmium, titanium, vanadium, chromium, iron, iron-based alloy, nickel-based alloy, zirconium, niobium, molybdenum, tantalum, tungsten, rhenium, silica, alumina, or combinations thereof. After the at least one material 110 and—optionally—baffle 114 (not shown) have been placed in the open chamber 108 defined by the at least one wall 602 and closed end 606, lid 640 having an integral fill tube 642 is then joined to the at least one wall 602 opposite closed end 606, by a pipe thread seal, a metal-to-metal compression or gasket seal or, more preferably, by welding. Lid 640 is preferably sealed to the at least one wall 602 in either a vacuum or under a controlled atmosphere, such as a vacuum, the solvent vapor, or an unreactive gas, such as a noble gas (He, Ne, Ar, Kr, Xe) or nitrogen, so as not to expose the at least one material 110 to air. If the at least one material 110 is heat sensitive, the closed end 606 and a bottom portion of the at least one wall 602 may be chilled during the sealing operation in order to maintain the at least one material 110 at a temperature below which any decomposition or other degradation of either the at least one material 110 or solvent 112 occurs. Fill tube 642, now joined to capsule 600, is then attached to a vacuum manifold (not shown) without exposing the at least one material 110 to air. A solvent source, such as a vial or tank containing solvent 112, is also coupled to the vacuum manifold. The open chamber is evacuated through fill tube 642 to a predetermined pressure of less than about 1 torr and, preferably, less than about 1 millitorr. The open chamber is cooled to a temperature at which solvent 112 is either a solid or liquid, and the vapor pressure of solvent 112 is less than that in the solvent source, preferably below 760 torr. Once the open chamber is sufficiently cooled, the solvent source is placed in fluid communication with the open chamber. Solvent 112 is then introduced into the open chamber by either condensation or injection. After a predetermined amount of solvent 112 has been introduced into the open chamber, fill tube 642 is then sealed by means of at least one of a pinch-off cold weld, a hot weld, a cold-welded plug, or the like to form the sealed end of the capsule. Once sealed, the chamber 608 within capsule 600 is substantially air-free, and the at least one material 110 contained therein can be processed with reduced risk of contamination.

Figure 4:
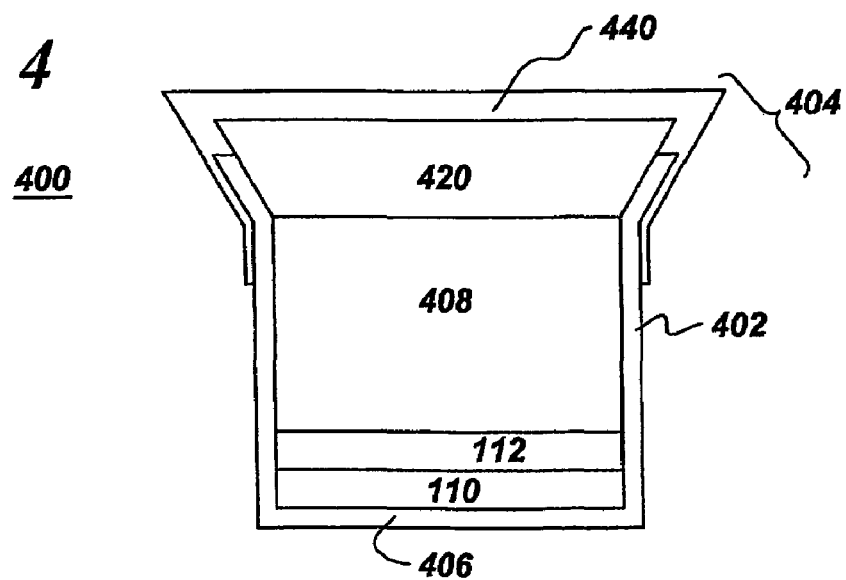
FIG. 4 is a schematic cross-sectional representation of a capsule of the present invention in which the sealed end of the capsule includes a cold-welded plug and an outer seal.

FIG. 4 illustrates another embodiment of the invention in which sealed end 404 of capsule 400 is formed by sealingly inserting a plug 420 into the opening of the open chamber defined by the at least one wall 402 opposite closed end 406. Plug 420 is a cold-weldable material formed from at least one of copper, copper-based alloy, gold, silver, palladium, platinum, iridium, ruthenium, rhodium, osmium, iron, iron-based alloy, nickel, nickel-based alloy, and combinations thereof. Plug 420 preferably has a diameter that tapers down to the diameter of chamber 408.

After the at least one material 110 and optionally—baffle 114 (not shown) have been placed in the open chamber and a predetermined quantity of solvent 112 has been added, plug 420 is inserted into the opening of the open chamber defined by the at least one wall 402 opposite closed end 406, preferably in either a vacuum or under the vapor pressure of solvent 112 so as not to expose the at least one material 110 to air. Pressure is applied to cold weld plug 420 to a portion of an inner surface of the at least one wall 402 and thus form an airtight seal. An additional outer seal 440 may then be provided to sealed end 404 by cold welding, hot welding, swaging, compression, or the like. Outer seal 440 may be formed from at least one of copper, copper alloy, gold, silver, palladium, platinum; iridium, ruthenium, rhodium, osmium, vanadium, titanium, nickel, nickel alloys, stainless steel, other iron-based alloys, and combinations thereof. Outer seal 440 may comprise a complete outer capsule surrounding the inner capsule defined by closed end 406, at least one wall 402, and plug 420. Once sealed, the closed chamber 408 within capsule 400 is substantially air-free, and the at least one material 110 contained therein can be processed with reduced risk of contamination.

Figure 7:
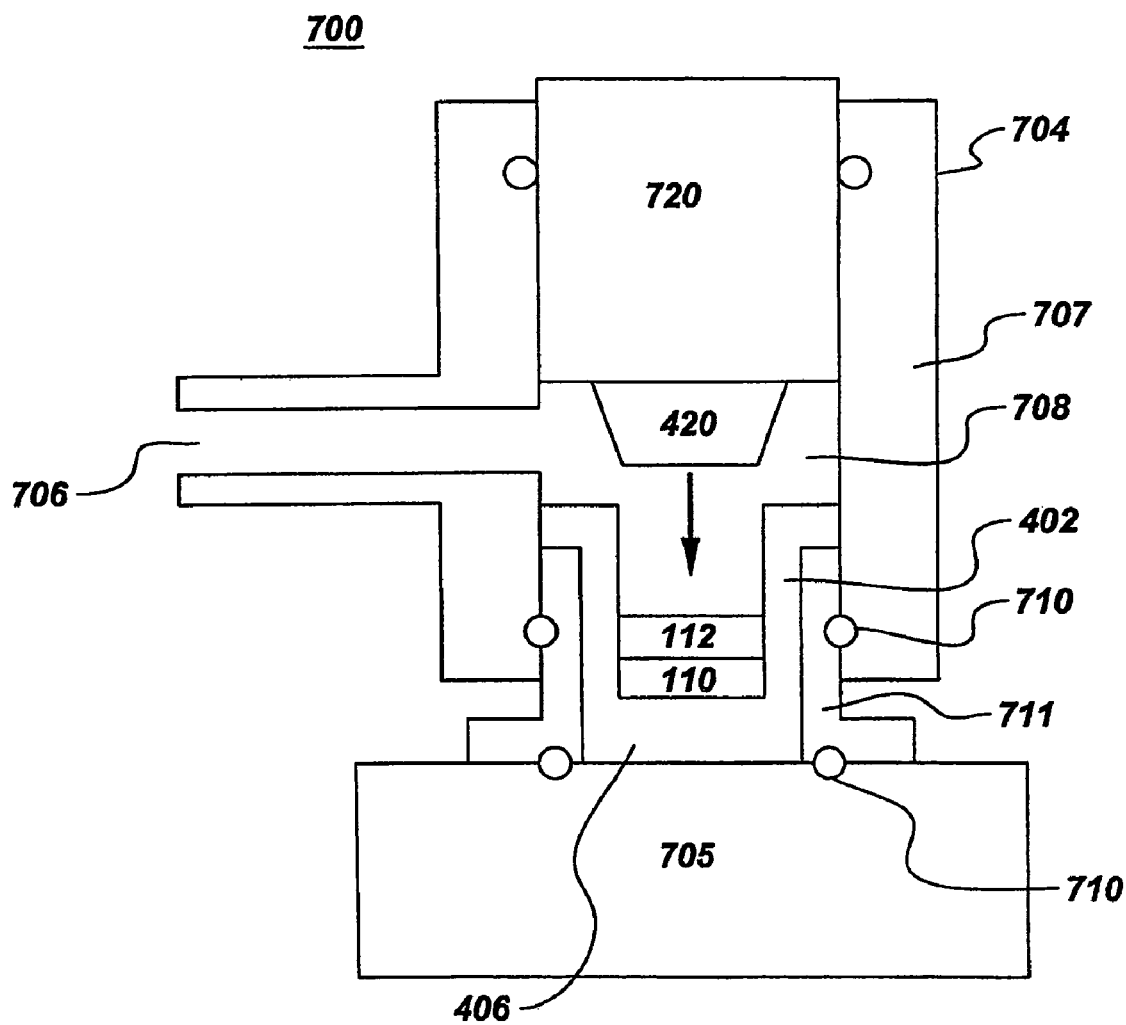
FIG. 7 is a schematic representation of an apparatus for sealing the capsule of the present invention.

FIG. 7 shows a filler/sealing assembly 700 for inserting plug 420 into the opening of the open chamber defined by the at least one wall 402 opposite closed end 406. The at least one material 110 to be processed in a supercritical fluid at high pressure and high temperature is added to the capsule 400 inside a glove box or other controlled-atmosphere container and transferred to filler/sealing assembly 700, which is also preferably located within the glove box. Filler/sealing assembly 700 permits plug 420 to be inserted in either a vacuum, under the vapor pressure of the solvent after filling, or under a controlled atmosphere, such as a noble gas (He, Ne, Ar, Kr, Xe) or nitrogen. Closed end 406 and at least one wall 402 of capsule 400 are supported by mechanical support 704. Mechanical support 704 also includes: a base 705 for supporting capsule 400 and providing a vacuum seal; support sleeve 711; guide sleeve 707; and vacuum inlet 706. Ram 720 passes through guide sleeve 707 and inserts plug 402 into capsule 400, forming a airtight cold weld between plug 420 and a portion of an inner surface of the at least one wall 402. Inner chamber 708 is rendered airtight by static seals between support sleeve 711 and base 705 and between support sleeve 711 and guide sleeve 707 and by a linear-motion seal between ram 720 and guide sleeve 707. The seals may comprise either o-rings, which are preferably formed from silicone, or metal-to-metal seals. Linear motion can be achieved with metal seals by means of formed bellows. Filler/sealing assembly 700 is coupled to a vacuum manifold (not shown) through vacuum inlet 706 such that inner chamber 708 may be placed in fluid communication with the vacuum manifold. A solvent source (not shown), such as a vial or tank containing solvent 112, is also coupled to the vacuum manifold and may be placed in fluid communication with the vacuum manifold and, through vacuum inlet 706, inner chamber 708. Airtight inner chamber 708 is then placed in fluid communication with the vacuum manifold and evacuated to a predetermined pressure of less than about 1 torr and, preferably, less than about 1 millitorr. Base, plate 705, support sleeve 711, and capsule 400 are cooled to a temperature at which solvent 112 is either a solid or liquid, and the vapor pressure of solvent 112 within chamber 708 is less than that of the solvent source, preferably below 760 torr. Once the capsule 400 is sufficiently cooled, the solvent source is placed in fluid communication with inner chamber 708 through vacuum inlet 706 and solvent 112 is introduced into the open capsule by condensation. After a predetermined amount of solvent 112 has been introduced into the open capsule, a valve in the vacuum manifold is closed to prevent escape of solvent and assembly 700 is allowed to warm. Pressure is applied to ram 720 to insert plug 420 into the opening of the open chamber defined by the at least one wall 402 opposite closed end 406. The pressure applied by ram 720 to plug 420 is sufficient to cold weld plug 420 to the at least one wall 402 and thus create the sealed end 404 of capsule 400. Once sealed, the closed chamber 108 within capsule 400 is substantially air-free, and the at least one material 110 contained therein can be processed with reduced risk of contamination.

The various embodiments of the capsule of the present invention, as described herein, are self-pressurizing. That is, the high pressures required for processing with supercritical fluids, rather than being externally applied to the capsule, are generated within the capsule itself. The capsule is self-pressurizable up to between about 1 atm (·1 bar) and about 80 kbar. In one embodiment, the capsule is pressurizable up to between about 5 kbar and about 80 kilobar. In another embodiment, self-pressurizing capsule 12 is pressurizable up to between about 5 kbar and about 60 kilobar. As the capsule 12 is heated, the vapor pressure of the solvent within capsule 12 increases. The vapor pressure of the solvent at a given temperature can be determined from the phase diagram of the solvent. At sufficiently high processing temperatures and pressures—such as, for example, above about 5 kbar and about 550° C. and, preferably, at pressures between 5 kbar and 80 kbar and temperatures between 550° C. and about 1500° C.—the solvent becomes a supercritical fluid. As the internal pressure within the capsule increases, the walls of the capsule deform outward and press against a pressure transmission medium.

Because the pressure that is needed for processing with supercritical fluids is generated internally within the capsule itself, the capsule of the present invention does not require a conventional pressure device to externally supply high pressure. In such conventional pressure devices, the pressure response, which is defined as the percent increase in cell pressure divided by the percent increase in press force that produces the increased cell pressure relative to a reference operating condition, is typically high, ranging from near unity for piston cylinder presses to about 50% for belt-type presses and multi-anvil presses. Under such circumstances, precise control of the pressure applied to the capsule via the press force is required in order to prevent the capsule from either bursting or being crushed.

In contrast to conventional pressure devices; the pressure device that is preferably used in conjunction with the capsule of the present invention need only provide a pressure sufficient to counterbalance the pressures generated within the capsule and prevent the capsule from bursting. The pressure device is a "zero stroke" HPHT apparatus, in which the pressure response is below 0.2, and, more preferably, below 0.05. A zero stroke HPHT apparatus is much easier to control in supercritical-fluid-processing applications, and is able to capture or contain the pressure generated within the capsule with little or no tendency to crush it. Although some stroking (e.g., an increase or decrease in the separation between the punches or anvils) may occur during operation, the extent of stroking is much smaller than in previous designs.

Such a pressure device is described in the U.S. patent application Ser. No. 09/683,658, filed on Jan. 31, 2002, by Mark Philip D'Evelyn et al. entitled "Improved Pressure Vessel," which is incorporated herein by reference in its entirety. The pressure vessel comprises the capsule disclosed in the present invention, a pressure transmission medium surrounding the capsule for maintaining an outer pressure on the capsule, a heating element insertable in the pressure transmission medium such that the heating element surrounds the capsule, a restraint to contain and hold in place the capsule, the pressure transmission medium, the heating element, and at least one seal between the restraint and the pressure transmission medium for preventing escape of the pressure transmission medium.

The capsule may be used to process a variety of materials, including, but not limited to, high quality gallium nitride single crystals. Such gallium nitride single crystal are formed by: providing at least one gallium nitride source material to the chamber of the capsule; placing the chamber in fluid communication with a vacuum manifold and evacuating the chamber to a predetermined pressure; filling the chamber with a predetermined quantity of a solvent that becomes a supercritical fluid at high temperature and high pressure; sealing the open sealable end of the capsule; disposing the sealed capsule within a pressure vessel; and subjecting the capsule to high pressure, high temperature conditions in a zero stroke pressure device. For GaN, HPHT conditions include pressures greater than 5 kbar and temperatures of at least about 550° C.

The following examples serve to illustrate the features and advantages offered by the present invention, and are not intended to limit the invention thereto. In particular, the examples illustrate the advantages of using a cold weldable plug (schematically shown in FIG. 4) to seal the capsule rather than forming a pa ched-off seal. Examples 1 and 2 describe capsules that have been sealed by forming a pinched-off seal, whereas Examples 3, 4, and 5 describe capsules that have each been sealed with a cold weldable plug.

EXAMPLE 1

Approximately 0.015 g of GaN powder and 0.002 g of Li3N powder were mixed and pressed into a pill. The pill was inserted into a 0.175 inch diameter copper tube having a closed end and an open end. The open end of the copper tube was then attached to a vacuum manifold and evacuated. The gas manifold had two valves in series to allow the copper tube to be connected and disconnected from the manifold without exposing either the interior volume of the tube or the manifold to air. Approximately 0.048 g of NH3 was added to the copper tube by cooling the end of the tube with liquid nitrogen and condensing ammonia from the vacuum manifold. The quantity of ammonia added was determined by weighing the copper tube before and after filling. The open end of the copper tube was then pinched off using a hydraulic pinch-off press to form a capsule in which the only gas present within the capsule was the ammonia that had previously been condensed within the copper tube. The bottom portion of the capsule (i.e., the portion having the closed end) was placed in a salt (NaCl) sleeve. The sleeve and capsule were then placed in a steel die and additional salt was added to the die and pressed to form a dense cap over the irregularly-shaped pinched-off end of the capsule. The capsule/salt assembly was then placed inside a cell having a heater tube and the cell was inserted into a piston-cylinder press with a die having a 0.5 inch diameter. The cell was heated to approximately 500° C. at a pressure of about 8 kbar. The cell was held for 60 minutes at HPHT and then cooled and removed from the press. The capsule was removed from the cell by dissolving the salt in water. The capsule held only 0.035 g of ammonia, indicating that 27% of the ammonia was lost during processing under HPHT conditions.

EXAMPLE 2

Approximately 3.25 g of pure water was added to a 0.5 inch diameter copper tube having a closed end and an open end. The tube was then pinched off to form a capsule as described in Example 1. The capsule was embedded in salt and the capsule/salt assembly was then inserted into a cell and placed in a zero-stroke HPHT vessel as described in U.S. patent application Ser. No. 09/1683,658, filed on 31 Jan. 2002, by Mark Philip D'Evelyn et al., entitled "improved Pressure Vessel". The capsule was heated to 360° C. Based on the phase diagram of water, the pressure within the capsule was approximately 1.6 kbar. The capsule/salt assembly was cooled and removed from the press, and the capsule was recovered by dissolving the salt pressure transmission medium in water. The capsule was found to contain only 1.38 g of water, indicating that 58% of the water leaked from the capsule during processing under HPHT conditions.

EXAMPLE 3

Approximately 0.21 g of GaN and 0.10 g of NH4F were added to a 0.5 inch diameter OFHC copper tube having a closed end and an open end. A plug having a beveled end for sealing the open end of the copper tube was machined from OFHC copper. To improve the chemical inertness of the capsule, both the plug and the interior of the copper tube were electroplated with a rhodium diffusion barrier and a gold coating, having thicknesses of 2 and 25 microns, respectively. Loading of the copper tube with GaN and NH4F was carried out under a nitrogen atmosphere within a glove box.

A capsule filler/sealing assembly similar to that shown in FIG. 7 was also located within the glove box. The guide sleeve was fabricated by reaming a 11-inch" Ultra Torr® Union through and welding a fill tube to the side. The support sleeve, having a 0.5 inch inner diameter, and top piston were fabricated from hardened tool steel, and the base flange was fabricated from stainless steel. Silicone o-rings provided both static and sliding seals.

The copper capsule and plug were placed into the filler/sealing assembly in the glove box. The filler/sealing assembly was then sealed, thereby enclosing and sealing nitrogen from the glove box into the capsule. The assembly was removed from the glove box and attached to a vacuum manifold and evacuated. The base and support sleeve were cooled in a dry ice/acetone bath and the manifold was then pressurized with ammonia, which was then allowed to condense within the capsule inside the filler/sealing assembly. After the desired quantity of ammonia had condensed into the filler/sealing assembly, the filler/sealing assembly was again sealed, disconnected from the gas manifold, inserted into a small hydraulic press, and allowed to warm. The plug was then inserted into the open end of the capsule by applying pressure to the piston. The capsule was removed from the filler/sealing assembly and found by weight difference to hold 0.91 g of ammonia. The capsule was placed in a zero stroke HPHT apparatus and heated to about 650° C. for 18 hrs. Based on the phase diagram of ammonia and the amount of ammonia in the capsule, the pressure within the capsule was approximately 8 kbar. After cooling and recovery of the capsule from the cell, the capsule was found to contain approximately 0.84 g of ammonia; only 8% of the ammonia escaped from the capsule during processing under HPHT conditions. Thus, the escape of material from the capsule during HPHT processing was substantially mitigated by sealing the capsule with a cold-weldable plug and providing the capsule and plug with a gold coating and rhodium diffusion barrier.

EXAMPLE 4

Approximately 0.58 g of GaN, 0.100 g NH4F, and 0.01 g Mg3N2 were added to a 0.5 inch diameter OFHC copper tube having a closed end and an open end. A plug having a beveled end for sealing the open end of the copper tube was machined from OFHC copper. To improve the chemical inertness of the capsule, both the plug and the interior of the copper tube were electroplated with a nickel diffusion barrier and a gold coating, having thicknesses of 2 and 25 microns, respectively. Loading of the copper tube with GaN and NH4F was carried out under a nitrogen atmosphere within a glove box.

The capsule and plug were placed inside the filler/sealing assembly described in Example 3. A 0.5 inch diameter solid rod was placed in the support sleeve below the the capsule in the fill/seal assembly so that the top 0.4 inch of the capsule protruded from the top of the support sleeve. A steel ring, having an outer diameter of 0.675 inch, was placed over the open end of the capsule. The capsule and filler/sealing assembly were transferred to the gas manifold as described in Example 3 and filled with 1.00 g of ammonia. After moving the assembly to the press and warming, the plug was inserted into the open top end of the capsule, such that the steel ring surrounded the plug and provided reinforcement. The capsule was then removed from the filler/sealing assembly and inserted in the zero stroke HPHT apparatus described in Examples 2 and 3. The cell was heated to approximately 675° C. for 65 hours. Based on the ammonia fill and phase diagram, the pressure within the capsule under HPHT conditions was about 10 kbar. Upon recovery, the capsule was found to contain 1.00 g of ammonia, indicating that essentially no leakage of ammonia occurred. Thus, no escape of material from the capsule during HPHT processing was detected when the capsule was sealed with a cold-weldable plug, the capsule and plug were provided with a gold coating and nickel diffusion barrier, and the seal was reinforced by a steel ring.

EXAMPLE 5

A capsule, having a 0.5 inch diameter, and a plug for sealing the open end of the capsule with a beveled end were machined from a rod of 99.99%-pure silver. Approximately 0.34 g of GaN and 0.10 g NH4F were added to the capsule and the capsule was enclosed within the filler/sealing assembly together with a 0.675 inch diameter steel ring as described in Example 4. The capsule and filler/sealing assembly were transferred to the gas manifold as described in Examples 3 and 4, and then filled with 1.00 g of ammonia. Next, the plug was inserted into the open top end of the capsule, such that the steel ring surrounded the plug and provided reinforcement. The capsule was then removed from the filler/sealing assembly and inserted in the zero stroke HPHT apparatus described in Examples 2-4. The cell was heated to approximately 625° C. for 127 hours. Based on the ammonia fill and phase diagram, the pressure within the capsule under HPHT conditions was about 9 kbar. Upon recovery of the capsule after the conclusion of the run, it was found to contain 1.0 g of ammonia, indicating that essentially no leakage of ammonia occurred. Thus, no detectable escape of material from the silver capsule during HPHT processing was observed when the capsule was sealed with a cold-weldable plug.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A method, comprising: disposing a material in a chamber, the chamber being defined by an inner surface of a capsule and the chamber being configured to receive a material and a solvent, and the capsule having a wall, a closed end, and a sealable end spaced from the closed end; joining a lid with a fill tube to the sealable end, evacuating the chamber by means of the fill tube, filling the chamber with solvent to a predetermined level by means of the fill tube, sealing the fill tube, increasing the and pressure in the chamber to render supercritical and growing a crystalline composition in the supercritical solvent whereby sealing the sealable end structure comprises forming barrier that is impermeable to supercritical solvent at the operating temperature and pressure.

2. The method as defined in claim 1, wherein the increasing the temperature in the chamber to an operating temperature causes the increase in the pressure in the chamber to the operating pressure.

3. The method as defined in claim 1, further comprising counterbalancing the operating pressure generated within the chamber by the supercritical solvent at the predetermined temperature.

4. The method as defined in claim 1, wherein evacuating comprises applying a negative pressure or a vacuum to the chamber sufficient to reduce the pressure in the chamber to less than about 1 Torr.

5. The method as defined in claim 1, wherein the capsule is deformable, and the operating pressure is sufficiently high to deform the deformable capsule at the operating pressure.

6. The method as defined in claim 1, wherein the lid has a first pipe thread, and the sealable end structure has a second pipe thread configured to engage the first pipe thread, and further comprising sealing the lid to the wall at the sealable end structure by forming a pipe thread seal.

7. The method as defined in claim 1, further comprising forming a compression fitting seal with a compression fitting of the lid to the wall at the sealable end structure.

8. The method as defined in claim 1, further comprising sealing the lid to the wall at the sealable end structure by a gasket seal formed by a gasket.

9. The method as defined in claim 1, further comprising torch welding, arc welding, ultrasound welding, or vibratory welding the lid.

10. The method as defined in claim 1, wherein disposing the material and the solvent in the chamber comprises excluding air from the chamber.

11. The method as defined in claim 10, wherein sealing the sealable end structure forms an air impermeable seal to block entry or infiltration of air from the ambient environment into the chamber prior to and during growth of the crystalline composition.

12. The method as defined in claim 1, further comprising reducing the temperature of the solvent prior to disposing the solvent in the chamber sufficiently to condense or liquefy the solvent.

13. The method as defined in claim 1, further comprising disposing a second capsule into the chamber, and the solvent and the material are disposed in the second capsule.

14. The method as defined in claim 1, further comprising dissolving the material into supercritical solvent prior to growing the crystalline composition.

15. The method as defined in claim 1, wherein the capsule further comprises a baffle disposed in the chamber to define first and second regions in the chamber separated by the baffle, and further comprising dissolving the material in the first of the two regions and growing the crystalline composition in the second of the two regions.

16. The method as defined in claim 1, wherein sealing is performed in the substantial absence of oxygen.

17. The method as defined in claim 1, wherein the step of joining said lid with said fill tube to said sealable end of the chamber is performed without exposing the material to air.

18. The method as defined in claim 1, wherein the temperature is greater than 550 degrees Celsius and the pressure is greater than 5 kbar.

19. The method as defined in claim 1, wherein the step of increasing the temperature and pressure in the chamber is performed by means of a zero-stroke high pressure apparatus.

* * * * *